United States Patent
Zhou et al.

(10) Patent No.: US 8,913,897 B2
(45) Date of Patent: Dec. 16, 2014

(54) LASER DIODE, METHOD FOR MANUFACTURING LASER DIODE AND PASSIVE OPTICAL NETWORK SYSTEM

(75) Inventors: Xiaoping Zhou, Shenzhen (CN); Xuejin Yan, Santa Clara, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 295 days.

(21) Appl. No.: 13/482,755

(22) Filed: May 29, 2012

(65) Prior Publication Data

US 2012/0275793 A1    Nov. 1, 2012

Related U.S. Application Data

(63) Continuation of application No. PCT/CN2011/084833, filed on Dec. 28, 2011.

(30) Foreign Application Priority Data

Apr. 29, 2011  (CN) .......................... 2011 1 0110646

(51) Int. Cl.
  *H04B 10/00*  (2013.01)
  *H01S 5/10*  (2006.01)
  *H01S 5/0625*  (2006.01)
  *H01S 5/34*  (2006.01)
  *H04J 14/02*  (2006.01)

(52) U.S. Cl.
  CPC ............. *H01S 5/106* (2013.01); *H01S 5/06255* (2013.01); *H01S 5/1096* (2013.01); *H01S 5/34* (2013.01); *H04J 14/0282* (2013.01); *H01S 2304/00* (2013.01)
  USPC ............................. 398/164; 398/183; 398/200

(58) Field of Classification Search
  CPC ............... H04B 10/501; H04B 10/503; H04B 10/50575; H04B 10/50595
  USPC ......................................... 398/164, 183, 200
  See application file for complete search history.

(56) References Cited

U.S. PATENT DOCUMENTS 4,794,346 A    12/1988 Miller
5,756,373 A *  5/1998 Sakata ............................ 438/35
(Continued)

FOREIGN PATENT DOCUMENTS

CN         1747265 A      3/2006
KR    1020050048111 A     5/2005
(Continued)

OTHER PUBLICATIONS

International Search Report in corresponding International Patent Application No. PCT/CN2011/084833 (Mar. 29, 2012).
(Continued)

*Primary Examiner* — Dzung Tran
(74) *Attorney, Agent, or Firm* — Leydig, Voit & Mayer, Ltd.

(57) ABSTRACT

Embodiments of the present disclosure provide a laser diode. The laser diode includes: a semiconductor substrate, a waveguide layer and a light wave limiting layer. The waveguide layer is disposed on the semiconductor substrate, and comprises a quantum well layer. The light wave limiting layer is disposed on a surface of the waveguide layer, and is configured to limit a light wave to be transmitted in the waveguide layer. The quantum well layer includes a plurality of quantum well regions that are disposed along a transmission direction of the light wave, and the quantum well regions respectively have gain peaks of different wavelengths. The embodiments of the present disclosure further provide a manufacturing method of a laser diode and a passive optical network system using the laser diode.

15 Claims, 5 Drawing Sheets

(56) References Cited

U.S. PATENT DOCUMENTS

| | | |
|---|---|---|
| 6,186,631 B1 | 2/2001 | Behringer et al. |
| 6,791,746 B2 * | 9/2004 | Lipson et al. ............... 359/344 |
| 2003/0151804 A1 | 8/2003 | Lipson et al. |
| 2006/0062267 A1 | 3/2006 | Tanaka |
| 2009/0129418 A1 * | 5/2009 | Matsumura ............... 372/44.01 |
| 2009/0310630 A1 * | 12/2009 | Takabayashi ............... 372/20 |
| 2011/0268402 A1 * | 11/2011 | Kiyota ............... 385/126 |
| 2012/0014398 A1 * | 1/2012 | Choi ............... 372/20 |

FOREIGN PATENT DOCUMENTS

| | | |
|---|---|---|
| WO | WO 03003085 A1 | 1/2003 |
| WO | WO 03044576 A2 | 5/2003 |

OTHER PUBLICATIONS

Song et al., "All-Optical OTDM Demultiplexing in a High-Yield Manufacturable Monolithic 3-bandgap SOA-MZI Switch by Regrowth-Free Selective Area MOVPE," ECOC Proceedings, 2005, vol. 3, IEEE, Washington, D.C.

Choa, "Growth and Processing Techniques for Fabricating Ultra Broadband High-Power Low-Cross-Talk Semiconductor Optical Amplifiers," LEOS 2006, $19^{th}$ Annual Meeting of the IEEE, Oct. 2006, IEEE, Washington, D.C.

Djordjev et al., "Two-Segment Spectrally Inhomogeneous Traveling Wave Semiconductor Optical Amplifiers Applied to Spectral Equalization," IEEE Photonics Technology Letters, May 2002, vol. 14, No. 5, IEEE, Washington, D.C.

* cited by examiner

LASER DIODE, METHOD FOR MANUFACTURING LASER DIODE AND PASSIVE OPTICAL NETWORK SYSTEM

CROSS-REFERENCE TO RELATED APPLICATION

This application is a continuation of International Application No. PCT/CN2011/084833, filed on Dec. 28, 2011, which claims priority to Chinese Patent Application No. 201110110646.1, filed on Apr. 29, 2011, both of which are hereby incorporated by reference in their entireties.

FIELD OF THE DISCLOSURE

The present disclosure mainly relates to optical communications technologies, an in particular, to a laser diode and a method for manufacturing the laser diode, and a passive optical network system that uses the laser diode.

BACKGROUND OF THE DISCLOSURE

With the increasing demands of users on bandwidth, a conventional broadband access system that uses copper wires gradually faces a bandwidth bottleneck. At the same time, the optical fiber communications technology that has huge bandwidth capacity becomes increasingly mature, and the application cost is decreased year by year. An optical fiber access network, for example, a passive optical network (PON), becomes more and more competitive for the next-generation broadband access network. Currently, in many solutions of an optical fiber access network, the wavelength-division multiplexing passive optical network (WDM PON) technology receives much concern due to its advantages such as larger bandwidth capacity and a communication manner that is similar to point-to-point manner and ensures information security.

Generally, a WDM PON system mainly includes multiple optical line terminal (OLT) transceiver modules located at a center room and multiple optical network unit (ONU) transceiver modules located at the client side, where the OLT transceiver module and the ONU transceiver module generally adopt a laser diode (LD) as a light source. Different ONU transceiver modules need to adopt different communication wavelengths ($\lambda 1, \lambda 2, \ldots \lambda n$) to perform communication with corresponding OLT transceiver modules, thus the WDM PON system requires that the laser diodes of different transceiver modules are capable of emitting optical signals of different wavelengths respectively. In order to implement colorlessness of light sources, reflective semiconductor optical amplifiers (RSOA) are proposed in the field to be the laser diodes, and seed light are injected to the RSOAs, so that different RSOAs are locked to different wavelengths respectively.

However, similar to other semiconductor devices, the conventional RSOA has a problem of rather obvious temperature sensitivity. Specifically, with change of temperature, the RSOA may generate phenomena such as gain spectrum drift and drop of a gain peak value. For example, with increase of temperature, the gain peak of the RSOA may drift toward a long wavelength direction (a temperature drift coefficient is about 0.5 nm/° C.), and a gain peak value drops at the same time. The changes of the gain directly influence the performance of the WDM PON system, for example, the changes of the gain may result in problems of the WDM PON system such as reduction of signal extinction ratio, shortening of transmission distance, and an increase of bit error ratio.

SUMMARY OF THE DISCLOSURE

Embodiments of the present disclosure provide a laser diode and a method for manufacturing the laser diode, which may solve the foregoing problem of temperature sensitivity. At the same time, an embodiment of the present disclosure further provides a passive optical network system that uses the laser diode.

A laser diode includes a semiconductor substrate; a waveguide layer disposed on the semiconductor substrate; and a light wave limiting layer disposed on a surface of the waveguide layer, which is configured to limit a light wave to be transmitted in the waveguide layer. The waveguide layer includes a quantum well layer, where the quantum well layer includes a plurality of quantum well regions that are disposed along a transmission direction of the light wave, and the quantum well regions respectively have gain peaks of different wavelengths.

A manufacturing method of a laser diode includes: providing a semiconductor substrate; growing a waveguide layer on the semiconductor substrate, where the waveguide layer includes a quantum well layer that has a plurality of quantum well regions, the quantum well regions are disposed along a transmission direction of a light wave, and respectively have gain peaks of different wavelengths; and forming a light wave limiting layer on a surface of the quantum well layer.

A passive optical network system includes an optical line terminal and a plurality of optical network units, where the optical line terminal is connected to the optical network units through an optical distribution network. The optical line terminal and/or optical network unit includes the foregoing laser diode.

The laser diode provided in the embodiment of the present disclosure has multiple quantum well regions that have gain peaks of different wavelengths disposed in the quantum well layer along the transmission direction of a light wave, so that the light wave has to pass through the quantum well regions that have gain peaks of different wavelengths during transmission. Therefore, a final gain effect of the light wave in the laser diode is mutual superposition of different gain peaks of the multiple quantum well regions. Compared with the existing technique, the superposition of the gain peaks may greatly increase the gain spectrum width of the laser diode, and therefore, even drift of a certain gain peak and a drop of a peak value of the gain peak occurs due to temperature change, the laser diode provided in the embodiment of the present disclosure can still ensure that the light wave has a desired gain effect in a relatively wide spectrum range due to the compensation of other gain peaks. Therefore, reducing the influence brought by the temperature change to the optical gain can be reduced, and the problem of temperature sensitivity of the laser diode that might otherwise exist can be solved.

DETAILED DESCRIPTION OF THE EMBODIMENTS

Figure 1:
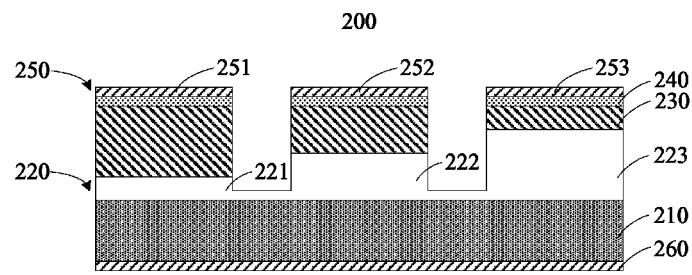
FIG. 1 is a schematic section diagram of a laser diode according to an embodiment of the present disclosure.

A laser diode and a method for manufacturing the laser diode provided in embodiments of the present disclosure are described in detail in the following with reference to specific embodiments.

In order to solve the problem of the laser diode that a gain spectrum thereof is influenced by temperature, an embodiment of the present disclosure first provides a semiconductor laser diode that has a quantum well layer, and multiple quantum well regions may be grown in the quantum well layer by using a selective growth technique, the multiple quantum well regions respectively have gain peaks with different wavelengths. In a specific embodiment, the multiple quantum well regions may be disposed along a transmission direction of a light wave inside the laser diode, so that the light wave has to pass through the quantum well regions that have gain peaks with different wavelengths during transmission. Based on the foregoing structure, a final gain effect of the light wave in the laser diode is mutual superposition of different gain peaks of the multiple quantum well regions, and the superposition of the gain peaks may greatly increase the gain spectrum width of the laser diode. Therefore, even drift of a certain gain peak and drop of a peak value of the gain peak may occur due to the temperature change, the laser diode provided in the embodiment of the present disclosure can still ensure that the light wave has a desired gain effect due to the compensation of other gain peaks. Therefore, the influence brought by the temperature change to the optical gain can be reduced, and the problem of temperature sensitivity of the laser diode that might otherwise exist can be solved.

In a specific embodiment, the laser diode may be manufactured by adopting a monolithic integration technique, and the laser diode may be an RSOA laser diode or other semiconductor laser diode, such as a DFB (Distributed Feed Back) laser diode or an FP (Fabry Perot), laser diode. Moreover, optionally, the laser diode may adopt Indium gallium arsenic phosphide (InGaAsP) material as an optical core layer, that is, the quantum well layer. The manufacturing process of the InGaAsP is more mature than that of Indium gallium aluminum arsenic (InGaAlAs), thus the laser diode may be implemented simply and with low cost.

In order to further improve the performance of the laser diode, in a specific embodiment, optionally, injection currents of the quantum well regions of the laser diode may be grading controlled. For example, each of the quantum well regions of the laser diode may be disposed with a respective electrode that is independent of and electrically isolated with other electrodes, where the independent electrodes are respectively configured to provide injection currents for a corresponding one of the quantum well regions thereof. According to the specific situation of gain peak drift resulted from temperature change, by changing the injection current of one or more quantum well regions, the gain values of the multiple quantum well regions may be grading controlled, thereby implementing selective gain compensation that is provided for the quantum well regions respectively according to the situation of gain peak drift, to further reduce the influence brought by the temperature change to the optical gain of the laser diode.

In order to better understand the laser diode provided in the embodiment of the present disclosure, the structure of the laser diode provided in the embodiment of the present disclosure is introduced in detail in the following with reference to the accompanying drawings, by taking that the quantum well layer of the laser diode has three quantum well regions as an example. It should be understood that, in a specific implementation, the number of the quantum well regions is not limited to three, and in practice, the number of the quantum well regions may depend on the actual gain configuration requirement of the laser diode.

Figure 2:
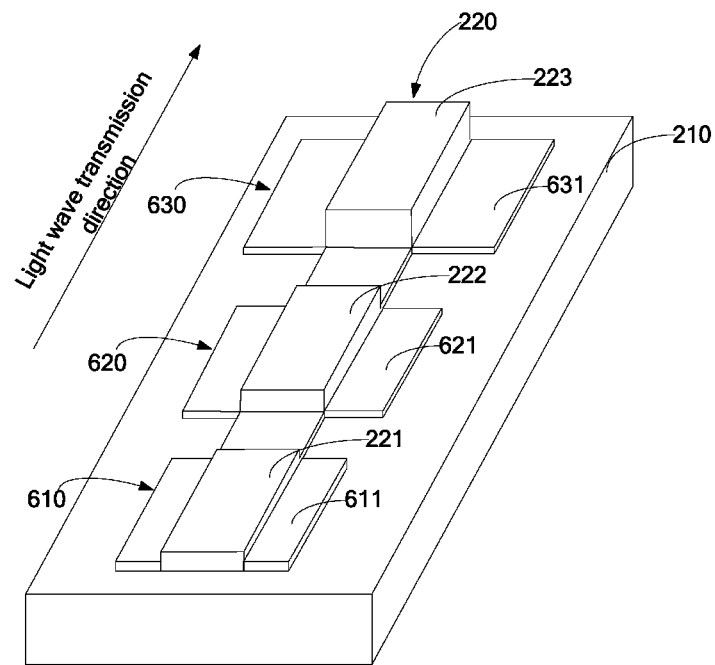
FIG. 2 is a schematic structure diagram of a quantum well layer of the laser diode shown in FIG. 1.

Referring to FIG. 1 and FIG. 2, FIG. 1 is a schematic section view of a laser diode according to an embodiment of the present disclosure, and FIG. 2 is a schematic structure diagram of a quantum well layer of the laser diode. The laser diode 200 includes a semiconductor substrate 210, a quantum well layer 220, a light wave limiting layer 230, an ohmic contact layer 240, a first electrode layer 250 and a second electrode layer 260. The first electrode layer 250 and the second electrode layer 260 may be served as an anode and a cathode of the laser diode 200 respectively. The semiconductor substrate 210, the quantum well layer 220, the light wave limiting layer 230 and the ohmic contact layer 240 may be disposed between the first electrode layer 250 and the second electrode layer 260 in that order from top to bottom.

In an embodiment, the semiconductor substrate 210 may be an indium phosphide (InP) substrate. The quantum well layer 220 is served as a waveguide layer of the laser diode 200, and a material of the quantum well layer 220 may be InGaAsP. Optionally, other optical limiting layers, for example, SCH (Separate Confinement Heterostructure) layers, may be added respectively on an upper surface and a lower surface of the quantum well layer 220 that are respectively adjacent to the surfaces of the substrate 210 and the light wave limiting layer 220 according to the requirement. That is to say, in a specific embodiment, the waveguide layer of the laser diode 200 may be a multi-layer structure including the quantum well layer 200 and the SCH layers, and may also be formed only by the quantum well layer 220.

The light wave limiting layer 230 may be a P-type doped InP, which is configured to limit the light wave of the laser diode 200 to be transmitted within the quantum well layer 220. The ohmic contact layer 240 may be a P-type heavy-doped Indium gallium arsenide (InGaAs) layer, which is configured to implement ohmic contact between the light wave limiting layer 230 and the first electrode layer 250 to reduce resistance therebetween and facilitate the current to be injected to the quantum well layer 220. In addition, optionally, another ohmic contact layer (not shown in the drawings) may also be disposed between the semiconductor substrate 210 and the second electrode layer 260 to reduce the resistance therebetween.

As shown in FIG. 2, the quantum well layer 220 may include multiple quantum well regions, and in order to better understand the present disclosure, FIG. 2 further schematically shows a mask pattern configured to form the multiple quantum well regions. However, it should be understood that, the mask pattern shown in FIG. 2 may only exist in the manufacturing process of the laser diode 200, and the mask pattern may not exist in actual products, for example, the mask pattern may be removed after forming the quantum well layer 220.

Figure 3:
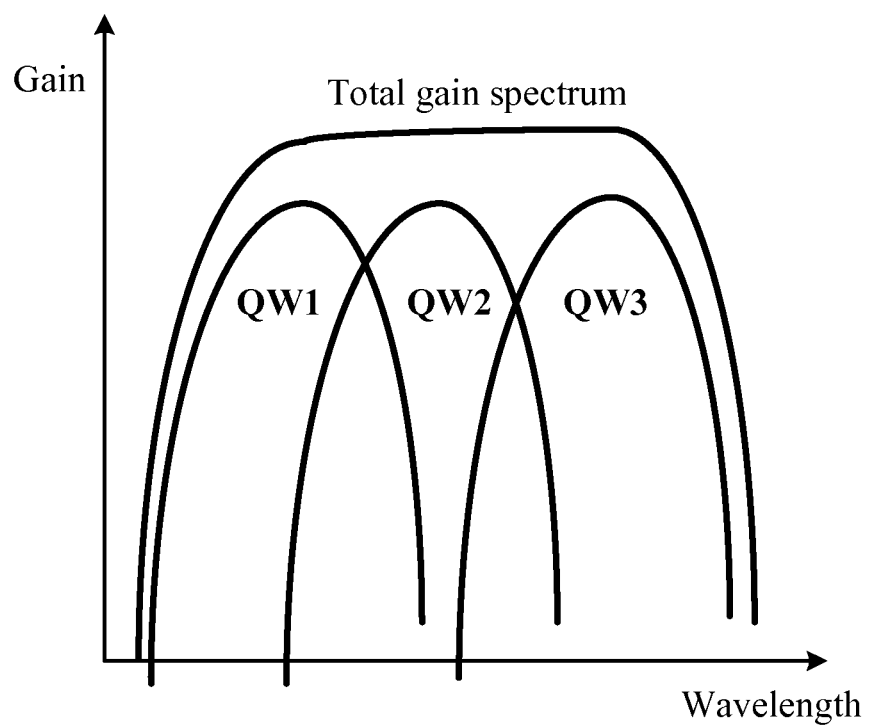
FIG. 3 is a schematic diagram of a gain spectrum of a laser diode according to an embodiment of the present disclosure.

In this embodiment, three quantum well regions are taken as an example, and for ease of description, the three quantum well regions are respectively named as a first quantum well region 221, a second quantum well region 222 and a third quantum well region 223 in the following, where, thickness H1, H2 and H3 of the first quantum well region 221, the second quantum well region 222 and the third quantum well region 223 may be different from one another, for example, H1<H2<H3, and thus the quantum well layer 220 has a stepped structure. Moreover, by using the selective growth technique as provided in the embodiment of the present disclosure, the first quantum well region 221, the second quantum well region 222 and the third quantum well region 223 may have different forbidden band (Eg) distribution, for example, Eg1>Eg2>Eg3, where Eg1, Eg2, and Eg3 respectively represent a band gap of the first quantum well region 221, the second quantum well region 222 and the third quantum well region 223. The forbidden band is directly corresponding to the wavelength of the gain peak, thus the quantum well layer 220 as shown in FIG. 2 may enable the first quantum well region 221, the second quantum well region 222 and the third quantum well region 223 respectively have gain peaks having different wavelengths, as shown in FIG. 3, where in term of the wavelength, QW1<QW2<QW3. Therefore, the laser diode 200 has a multi-stage gain spectrum, and a total gain spectrum of the laser diode 200 at least covers the superposition of the multi-stage gain spectrum corresponding to the first quantum well region 221, the second quantum well region 222 and the third quantum well region 223. It can be seen that, compared with the existing techniques, the laser diode 200 provided in the embodiment of the present disclosure may greatly increase the gain spectrum width of the laser diode, thereby implementing a better gain effect, and reducing the influence brought by the temperature change to the optical gain of the laser diode 200.

In addition, optionally, in an embodiment, the first electrode layer 250 may include multiple electrodes, for example, a first anode 251, a second anode 252, and a third anode 253. Each of the electrodes 251, 252, 253 has a position corresponding to a respective one of the quantum well regions 221, 222, 223 in the quantum well layer 220, and is configured to provide a received injection current to the corresponding one of the quantum well regions 221, 222, 223. The injection currents of the quantum well regions 221, 222, 223 may be different from one another, and may be adjustable. The adjustable injection current is used to implement grading control of the gain spectrums of the quantum well regions 221, 222, 223, so as to compensate the drift of the gain spectrums of the quantum well regions 221, 222, 223 that might be generated along with temperature change, thereby further reducing the influence brought by the temperature change to the optical gain of the laser diode 200.

Specifically, when the temperature increases, the gain spectrum of a part or all quantum well regions 221, 222, 223 of the laser diode 200 may drift toward the long wavelength direction, and in order to compensate the decrease of the gain in the short wavelength direction, the current applied to the first anode 251 in the laser diode 200 may be increased, so as to increase the injection current of the first quantum well region 221, thereby increasing the gain in the short wavelength region, and compensating the gain reduction in the short wavelength region resulted from the temperature drift. Moreover, the current applied to the third anode 253 may be reduced appropriately, so as to reduce the injection current of the third quantum well region 223, thereby reducing the gain in the long wavelength region, and reducing the influence brought by the increase of the gain in the long wavelength region resulted from the temperature drift. Definitely, when the temperature rises excessively, the current applied to the second anode 252 in the laser diode 200 may also be adjusted appropriately according to the requirement, for example, the current may also be increased at the same time, and the current increment may be less than the injection current increment of the first quantum well region 221.

Similarly, when the temperature drops, the gain spectrum of a part or all quantum well regions 221, 222, 223 of the laser diode 200 may drift toward the short wavelength direction, and in order to compensate the decrease of the gain in the long wavelength direction, the current applied to the third anode 253 in the laser diode 200 may be increased, so as to increase the injection current of the third quantum well region 222, thereby increasing the gain in the long wavelength region, and compensating the gain reduction in the long wavelength region resulted from the temperature drift. Moreover, the current applied to the first anode 251 may be reduced appropriately, so as to reduce the injection current of the first quantum well region 221, thereby reducing the gain in the short wavelength region, and reducing the influence brought by the increase of the gain in the short wavelength region resulted from the temperature drift. Similarly, when the temperature drops excessively, the current applied to the second anode 252 in the laser diode 200 may also be adjusted appropriately according to the requirement, for example, the current may also be increased at the same time, and the current increment may be less than the injection current increment of the third quantum well region 223.

Details of implementing of the laser diode 200 that has a multi-stage gain spectrum by using the selective growth technique provided in the embodiment of the present disclosure is described in the following through a method for manufacturing the laser diode 200.

Figure 4:
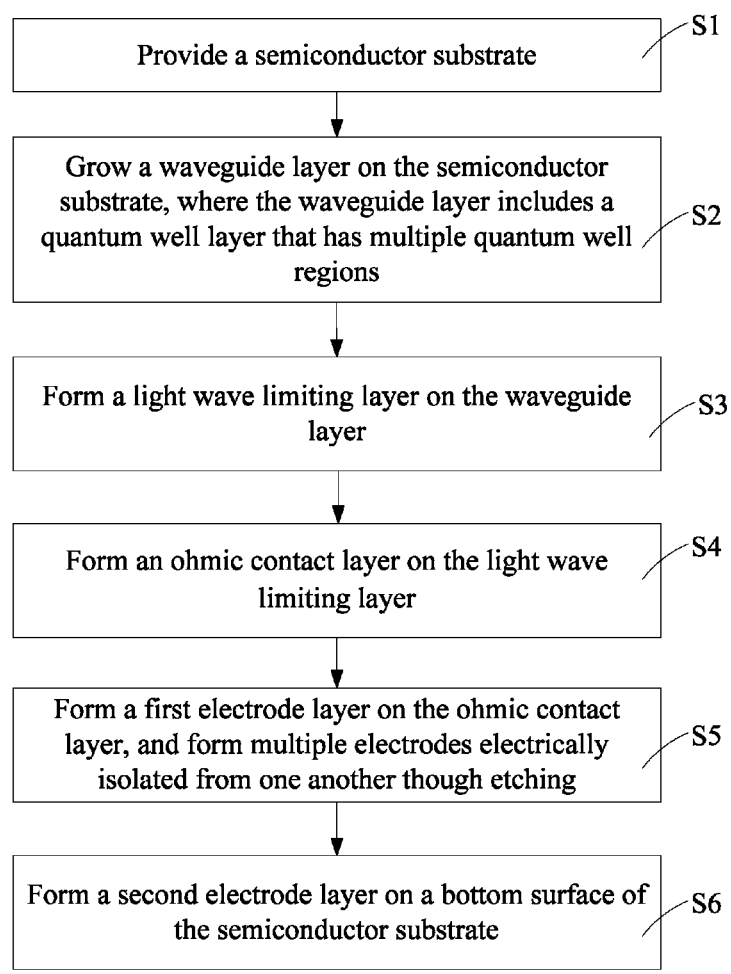
FIG. 4 is a flow chart of a method for manufacturing a laser diode according to an embodiment of the present disclosure.

Referring to FIG. 4, a flow chart of a method for manufacturing a laser diode according to an embodiment of the present disclosure is shown. The manufacturing method may include the following:

Step S1: Provide a semiconductor substrate 210, for example, an InP substrate.

Step S2: Grow a waveguide layer on the semiconductor substrate 210, where the waveguide layer includes a quantum well layer 220 that has multiple quantum well regions 221, 222, 223, and the multiple quantum well regions 221, 222, 223 respectively have gain peaks of different wavelengths;

Step S3: Form a light wave limiting layer 230 on the waveguide layer, for example, a P-type doped InP layer, so as to limit a light wave to be transmitted within the quantum well layer 220;

Step S4: Form an ohmic contact layer 240 on the light wave limiting layer 230, for example, a heavy-doped InGaAs layer;

Step S5: Form a first electrode layer 250 on the ohmic contact layer 240 to serve as an anode of the laser diode 200. Optionally, multiple electrodes 251, 252, 253 that are electrically isolated from one another may further be formed by etching the first electrode layer 250, and the positions of the multiple electrodes 251, 252, 253 are respectively corresponding to the quantum well regions 221, 222, 223 that have gain peaks of different wavelengths.

Step S6: Form a second electrode layer 260 on a bottom surface of the semiconductor substrate 210 (that is, a surface opposite to the first electrode layer 250), to serve as a cathode of the laser diode 200.

In a specific embodiment, in step S2, the quantum well layer 220 may be grown through a selective growth method, thereby obtaining the quantum well regions that have different gain spectrums, for example, the first quantum well region 221, the second quantum well region 222 and the third quantum well region 223 that are shown in FIG. 2.

Specifically, the selective growth method may include the following:

First, a mask that has a specific pattern is formed on a wafer surface of the semiconductor substrate 210. The mask may be a silicon dioxide ($SiO_2$) layer or a silicon nitride (SiN) layer. Specifically, a $SiO_2$ layer or SiN layer may be deposited on the wafer surface of the semiconductor substrate 210 first, and then the $SiO_2$ layer or SiN layer is etched to form the mask. The mask may include multiple mask pattern regions, where the multiple mask pattern regions are disposed sequentially according to a transmission direction of a light wave, and each mask pattern region is configured to grow a corresponding one of the quantum well regions during crystallization.

Figure 5:
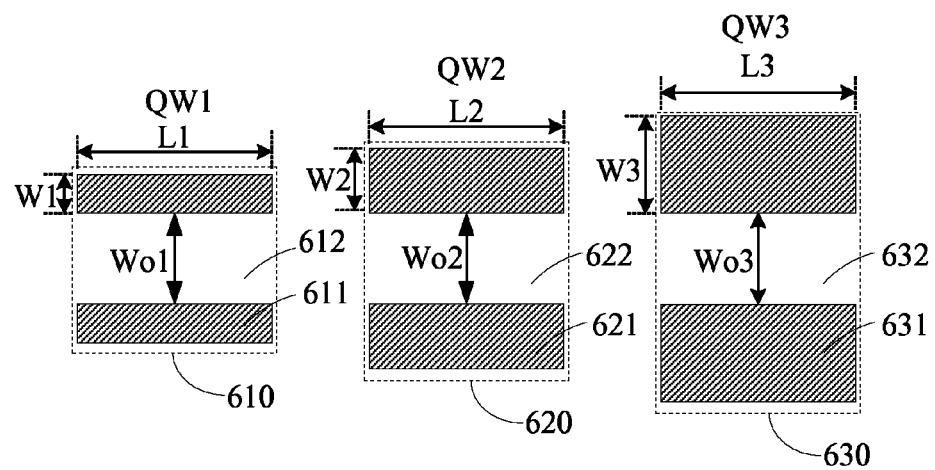
FIG. 5 is a schematic diagram of a pattern of a mask for generating a quantum well a used in the method for manufacturing the laser diode in FIG. 4.

For example, in an embodiment, the pattern of the mask may be as shown in FIG. 5, which includes a first mask pattern region 610, a second mask pattern region 620 and a third mask pattern region 630, where the three mask pattern regions are respectively corresponding to the first quantum well region 221, the second quantum well region 222 and the third quantum well region 223 that are to be generated. Each of the mask pattern regions 610, 620, 630 may include two mask patterns that are symmetric to each other and have the same shape. For ease of description, the mask patterns of the first mask pattern region 610, the second mask pattern region 620 and the third mask pattern region 630 are respectively defined as first mask patterns 611, second mask patterns 621 and third mask patterns 631 in the following.

Optionally, each mask pattern 611, 621, 631 may be rectangular, and two first mask patterns 611 of the first mask pattern region 610, two second mask patterns 621 of the second mask pattern region 620 and two third mask patterns 631 of the third mask pattern region 630 are respectively symmetric along a same symmetry axis, where an extension direction of the symmetry axis may specifically be the transmission direction of the light wave in the laser diode 200. In addition, the areas of the first mask pattern 611, the second mask pattern 621 and the third mask pattern 631 differ from one another, for example, in a specific embodiment, the first mask pattern 611, the second mask pattern 621 and the third mask pattern 631 may have the same length, that is, L1=L2=L3, but have different widths, for example, W1<W2<W3, so that the areas S1, S2 and S3 of the first mask pattern 611, the second mask pattern 621 and the third mask pattern 631 satisfy S1<S2<S3. Moreover, gaps Wo1, Wo2, Wo3 between the two first mask patterns 611, the two second mask patterns 621 and the two third mask patterns 631 are the same, that is Wo1=Wo2=Wo3, so that intermediate blank regions 612, 622 and 632 of the first mask pattern region 610, the second mask pattern region 620 and the third mask pattern region 630 that are not covered by the mask patterns 611, 621 and 631 have the same area.

Next, perform crystallization on the semiconductor substrate 210 by using the foregoing mask, so as to form the quantum well layer 220.

During the crystallization, in the first mask pattern region 610, the second mask pattern region 620 and the third mask pattern region 630, new crystalline layers cannot grow on regions that are covered by the first mask patterns 611, the second mask patterns 621 and the third mask patterns 631, and therefore, the crystalline layers mainly grow on the intermediate blank regions 612, 622 and 632 that are not covered by the mask patterns 611, 621, 631, as shown in FIG. 2. Moreover, during the crystallization, atoms at regions that are covered by the first mask patterns 611, the second mask patterns 621 and the third mask patterns 631 are concentrated in the intermediate blank regions 612, 622 and 632, and if the mask patterns 611, 621 and 631 are bigger, more atoms enter the intermediate blank regions 612, 622 and 632, that is, speed of the crystal growth is more rapid. Because the intermediate blank regions 612, 622 and 632 have the same area, if the mask patterns 611, 621 and 631 are bigger, thickness of the crystal is higher at the same time, and therefore, the formed quantum well regions are thicker.

In this embodiment, the areas of the first mask patterns 611, the second mask patterns 621 and the third mask patterns 631 satisfy S1<S2<S3, and therefore, in the quantum well layer 220 formed through the foregoing crystallization processing, the thickness of the first quantum well region 221, the second quantum well region 222 and the third quantum well region 223 respectively corresponding to the first mask pattern region 610, the second mask pattern region 620 and the third mask pattern region 630 satisfies H1<H2<H3, where H1, H2 and H3 respectively represent the thickness of the first quantum well region 221, the second quantum well region 222 and the third quantum well region 223.

Figure 6:
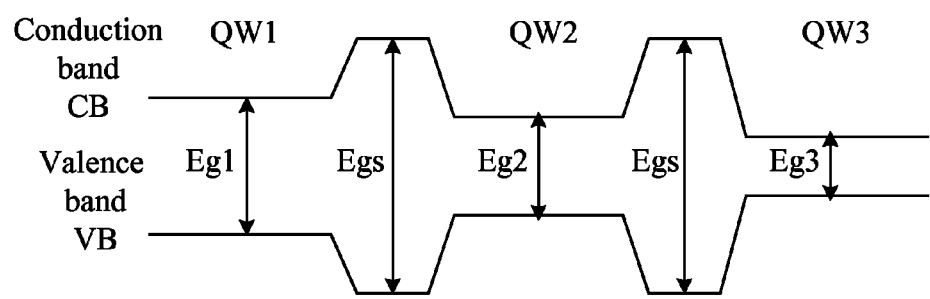
FIG. 6 is a schematic structure diagram of an energy band of the quantum well layer generated by using the mask in FIG. 5.

It can be seen according to the foregoing embodiment that, in the selective growth technique provided in the embodiment of the present disclosure, the thickness of the quantum well regions 221, 222 and 223 may be implemented by patterning the mask layer to have a specific mask pattern as required, that is, the quantum well layer 220 may implement the selective growth of the quantum well regions 221, 222 and 223 by use of specific mask patterns. According to the characteristic of the quantum well, in the premise that material composition components are fixed, if a quantum well region is thicker, its corresponding band gap is narrower, as shown in FIG. 6, so that the wavelength of the gain peak of the quantum well region is longer. Therefore, in the solution provided in the embodiment of the present disclosure, the mask patterns 611, 621 or 631 of the mask pattern regions 610, 620 and 630 corresponding to the quantum well regions 221, 222 and 223 may be changed to have different shapes (for example, having different widths as described the foregoing description), so that the different quantum well regions 221, 222 and 223 have gain peaks of different wavelengths.

In addition, it should be understood that, the solution described in the foregoing is only a specific embodiment of the selective growth technique provided in the embodiment of the present disclosure. Actually, the size (length or width) of the mask pattern, the pattern spacing of the mask pattern regions and the shape of the mask patterns may all be selectively adjusted, so as to implement the selective growth of the quantum well region that has the multi-stage gain spectrum.

For example, in an alternative embodiment, similarly, mask patterns 611, 621, 631 that have different lengths may also be used to enable the generated quantum well regions 221, 222 and 223 to have gain peaks of different wavelengths. Or, in another alternative embodiment, the pattern spacing Wo between two mask patterns 611, 621, 631 in each of the mask pattern regions 610, 620, 630 may also be changed, so that different mask pattern regions 610, 620, 630 have different pattern spacing, thereby obtaining the quantum well regions 221, 222 and 223 that have different gain peaks. Specifically, if pattern spacing Wo is smaller, a grown quantum well is thicker, and its corresponding band gap is narrower, and therefore, the wavelength of the gain peak of the quantum well region is greater. Or, in other alternative embodiments, the patterns of the mask patterns 611, 621 and 631 or the intermediate blank regions 612, 622 and 632 may also be designed to be other shapes having different sizes, such as, trapezoid, and in addition, the two mask patterns of each mask pattern region may also be unsymmetrical to each other.

On the other hand, it should be understood that, the foregoing method of selectively growing the quantum well regions 221, 222, 223 that have different gain peaks in a same crystallization process by using a mask that has a specific pattern is only a specific low-cost implementation for implementing the laser diode that has a multi-stage gain spectrum provided in the embodiment of the present disclosure. In order to increase the gain spectrum width of the laser diode to solve the temperature sensitivity problem of the laser diode in the existing techniques, persons skilled in the art may further implement the multi-stage gain spectrum through other technical solutions, for example, in an alternative embodiment, the quantum well layer 220 may further be formed through multiple crystallization process, where the quantum well regions 221, 222, 223 that have different gain peaks may be formed respectively in different crystallization processes by using multiple masks.

Figure 7:
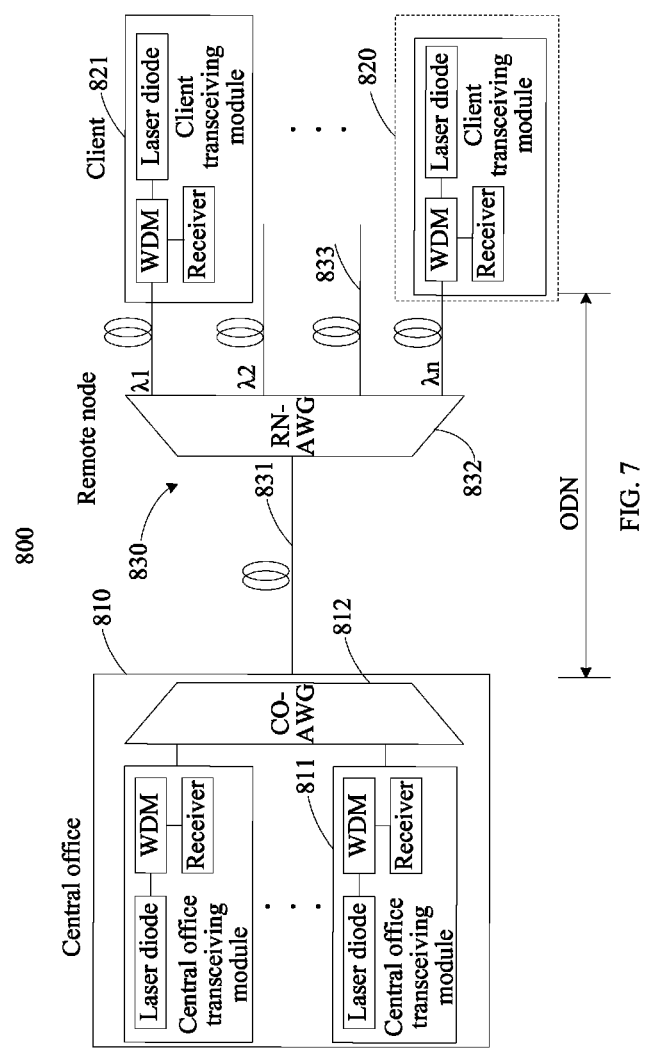
FIG. 7 is a schematic structure diagram of a WDM PON system according to an embodiment of the present disclosure.

Based on the foregoing laser diode 200, an embodiment of the present disclosure further provides a passive optical network system, the passive optical network system may be a wavelength division multiplexing passive optical network (WDM PON) system as shown in FIG. 7. The WDM PON system 800 includes an optical line terminal 810 located at the central office (CO) and a plurality of optical network units 820 located at the user side, where the optical line terminal 810 is connected to the optical network units 820 through an optical distribution network (ODN) 830. The optical distribution network 830 may include a trunk fiber 831, a wavelength division multiplexer/demultiplexer 832 and a plurality of branch fibers 833, where the trunk fiber 831 is connected to the optical line terminal 810, and is connected to the branch fibers 833 through the wavelength division multiplexer/demultiplexer 832, and the branch fibers 833 are respectively connected to the optical network units 820. The wavelength division multiplexer/demultiplexer 832 may be an array waveguide grating (AWG) that is disposed at a remote node (RN), that is, a remote AWG (RN-AWG).

The optical line terminal 810 includes a plurality of central office transceiver modules 811, and the OLT transceiver modules 811 are coupled to the trunk fiber 831 through another wavelength division multiplexer/demultiplexer 812 that is located at the central office, for example, a central office AWG (CO-AWG). Each optical network unit 820 respectively includes a user side transceiver module 821. The user side transceiver module 821 is corresponding to the central office transceiver module 811 one by one, and each pair of the central office transceiver module 811 and the user side transceiver module 821 respectively adopts a respective communication wavelength ($\lambda 1, \lambda 2, \ldots \lambda n$) to perform communication similar to point-to-point communication.

The central office transceiver module 811 and the user side transceiver module 812 respectively adopt the laser diode as a light source, and the laser diode may be a semiconductor laser diode, for example, an RSOA laser diode or a DFB laser diode. In a specific embodiment, the laser diode may be the laser diode 200 that has a multi-stage gain spectrum and is capable of implementing grading control of injection current, which is provided in the foregoing embodiment of the present disclosure, and for the structure and operation thereof, reference may be made to specific description of the foregoing embodiment, which are not repeated below.

The foregoing descriptions are merely exemplary embodiments of the present disclosure, but the protection scope of the present disclosure is limited thereto. Various variations and substitutions readily conceivable by persons skilled in the art within the technical solutions disclosed in the present disclosure fall within the protection scope of the present disclosure. Therefore, the protection scope of the present disclosure is subject to the appended claims.

What is claimed is:

1. A laser diode, comprising:
a semiconductor substrate;
a waveguide layer disposed on the semiconductor substrate, the waveguide layer comprising a quantum well layer;
a light wave limiting layer disposed on a surface of the waveguide layer, the light wave limiting layer being configured to limit a light wave to be transmitted within the waveguide layer;
wherein the quantum well layer comprises a plurality of quantum well regions disposed along a transmission direction of the light wave and the quantum well regions respectively have gain peaks of different wavelengths;
wherein the quantum well layer has a stepped structure, and the quantum well regions have thickness different from one another;
wherein the quantum well regions comprise:
a first quantum well region, a second quantum well region and a third quantum well region;
a wavelength of a gain peak of the second quantum well region is greater than a wavelength of a gain peak of the first quantum well region but is less than a wavelength of a gain peak of the third quantum well region;
wherein when the temperature rises, the injection current of the first quantum well region is increased to compensate gain spectrum drift resulted from rise of the temperature; and
when the temperature drops, the injection current of the third quantum well region is increased to compensate gain spectrum drift resulted from drop of the temperature.

2. The laser diode according to claim 1, further comprising:
a plurality of electrodes respectively corresponding to the plurality of quantum well regions;
wherein the electrodes are electrically isolated from one another, each of the electrodes is configured to provide a respective received injection current to the corresponding quantum well region.

3. The laser diode according to claim 2, wherein the injection currents of the quantum well regions are adjustable, and at least two of the injection currents of the quantum well regions are different.

4. The laser diode according to claim 1, wherein the quantum well regions of the quantum well layer are selectively grown by using a mask of a preset pattern.

5. The laser diode according to claim 1, wherein when the temperature rises, the injection current of the second quantum well region and the injection current of the first quantum well region are increased at the same time, and an injection current increment of the second quantum well region is less than an injection current increment of the first quantum well region;
when the temperature drops, the injection current of the second quantum well region and the injection current of the third quantum well region are increased at the same time, and an injection current increment of the second quantum well region is less than an injection current increment of the third quantum well region.

6. A manufacturing method of a laser diode comprising:
providing a semiconductor substrate;
growing a waveguide layer on the semiconductor substrate, wherein the waveguide layer comprises a quantum well layer that have a plurality of quantum well regions, and the quantum well regions are disposed along a transmission direction of a light wave and respectively have gain peaks of different wavelengths;

forming a light wave limiting layer on a surface of the waveguide layer;

wherein the growing the waveguide layer on the semiconductor substrate comprises:

generating a mask that has a specific pattern on a surface of the semiconductor substrate, wherein the mask has a plurality of mask pattern regions, and each of the mask pattern regions respectively comprises two mask patterns and an intermediate blank region that is located between the two mask patterns; and performing crystal growth on the semiconductor substrate by using the mask to form the quantum well layer, wherein the plurality of quantum well regions are grown respectively on the intermediate blank regions of the mask pattern regions.

7. The manufacturing method of the laser diode according to claim 6, wherein the quantum well layer that have quantum well regions is formed in a single growth process through a selective growth technique.

8. The manufacturing method of the laser diode according to claim 6, wherein the two mask patterns of each of the mask pattern regions have a same shape and are symmetric to each other.

9. The manufacturing method of the laser diode according to claim 6, wherein the mask comprises a first mask pattern region, a second mask pattern region and a third mask pattern region, and areas of mask patters of the first mask pattern region, the second mask pattern region and the third mask pattern region are different from one another.

10. The manufacturing method of the laser diode according to claim 9, wherein the mask patterns of the first mask pattern region, the second mask pattern region and the third mask pattern region are all rectangular, lengths and/or widths of the mask patterns of the first mask pattern region, the second mask pattern region and the third mask pattern region are different.

11. The manufacturing method of the laser diode according to claim 6, wherein the pattern spacing between the two mask patterns of the first mask pattern region, the second mask pattern region and the third mask pattern region is different from one another.

12. A passive optical network system, comprising: an optical line terminal and a plurality of optical network units, wherein the optical line terminal is connected to the optical network units through an optical distribution network; and the optical line terminal comprises a plurality of first laser diodes, wherein each of the first laser diode comprises:

a semiconductor substrate;

a waveguide layer disposed on the semiconductor substrate, the waveguide layer comprising a quantum well layer;

a light wave limiting layer disposed on a surface of the waveguide layer, the light wave limiting layer being configured to limit a light wave to be transmitted within the waveguide layer;

wherein the quantum well layer comprises a plurality of quantum well regions disposed along a transmission direction of the light wave and the quantum well regions respectively have gain peaks of different wavelengths;

wherein the quantum well layer has a stepped structure, and the quantum well regions have thickness different from one another;

wherein the quantum well regions comprise:

a first quantum well region, a second quantum well region and a third quantum well region;

a wavelength of a gain peak of the second quantum well region is greater than a wavelength of a gain peak of the first quantum well region but is less than a wavelength of a gain peak of the third quantum well region;

wherein when the temperature rises, the injection current of the first quantum well region is increased to compensate gain spectrum drift resulted from rise of the temperature; and when the temperature drops, the injection current of the third quantum well region is increased to compensate gain spectrum drift resulted from drop of the temperature.

13. The passive optical network system according to claim 12, further comprising:

a plurality of electrodes respectively corresponding to the plurality of quantum well regions;

wherein the electrodes are electrically isolated from one another, each of the electrodes is configured to provide a respective received injection current to the corresponding quantum well region.

14. The passive optical network system according to claim 12, wherein when the temperature rises, the injection current of the second quantum well region and the injection current of the first quantum well region are increased at the same time, and an injection current increment of the second quantum well region is less than an injection current increment of the first quantum well region;

when the temperature drops, the injection current of the second quantum well region and the injection current of the third quantum well region are increased at the same time, and an injection current increment of the second quantum well region is less than an injection current increment of the third quantum well region.

15. The passive optical network system according to claim 12, wherein each of the optical network units comprises a second laser diode, the second laser diode has a configuration substantially same as that of the first laser diode.

* * * * *

UNITED STATES PATENT AND TRADEMARK OFFICE
CERTIFICATE OF CORRECTION

PATENT NO. : 8,913,897 B2  
APPLICATION NO. : 13/482755  
DATED : December 16, 2014  
INVENTOR(S) : Zhou et al.

Page 1 of 1

It is certified that error appears in the above-identified patent and that said Letters Patent is hereby corrected as shown below:

*In the Claims*

Claim 9, column 11, line 29:

"and areas of mask patters" should read

"and areas of mask patterns"

Signed and Sealed this  
Tenth Day of November, 2015

Michelle K. Lee  
*Director of the United States Patent and Trademark Office*